(12) United States Patent
Daniels et al.

(10) Patent No.: US 11,127,645 B2
(45) Date of Patent: Sep. 21, 2021

(54) GROUNDING LIDS IN INTEGRATED CIRCUIT DEVICES

(71) Applicant: NXP USA, inc., Austin, TX (US)

(72) Inventors: Dwight Lee Daniels, Phoenix, AZ (US); Stephen Ryan Hooper, Mesa, AZ (US); Michael B. Vincent, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/446,388

(22) Filed: Jun. 19, 2019

(65) Prior Publication Data

US 2020/0402878 A1 Dec. 24, 2020

(51) Int. Cl.

| | |
|---|---|
| H01L 23/48 | (2006.01) |
| H01L 23/31 | (2006.01) |
| H01L 23/495 | (2006.01) |
| H01L 23/04 | (2006.01) |
| H01L 23/498 | (2006.01) |
| H01L 25/00 | (2006.01) |
| H01L 23/00 | (2006.01) |
| H01L 21/78 | (2006.01) |
| H01L 25/065 | (2006.01) |
| H01L 21/56 | (2006.01) |

(52) U.S. Cl.
CPC ........ *H01L 23/3121* (2013.01); *H01L 21/561* (2013.01); *H01L 21/78* (2013.01); *H01L 23/04* (2013.01); *H01L 23/315* (2013.01); *H01L 23/4952* (2013.01); *H01L 23/49838* (2013.01); *H01L 24/48* (2013.01); *H01L 24/85* (2013.01); *H01L 25/0657* (2013.01); *H01L 25/50* (2013.01); *H01L 2224/48145* (2013.01); *H01L 2224/48177* (2013.01)

(58) Field of Classification Search
CPC ... H01L 21/76898; H01L 24/82; H01L 25/50; H01L 25/105; H01L 24/24
See application file for complete search history.

(56) References Cited

U.S. PATENT DOCUMENTS

| | | | |
|---|---|---|---|
| 5,801,432 A * | 9/1998 | Rostoker | H01L 23/3121 257/666 |
| 7,030,469 B2 | 4/2006 | Mahadevan et al. | |
| 7,355,289 B2 * | 4/2008 | Hess | H01L 23/3677 257/787 |
| 8,399,972 B2 * | 3/2013 | Hoang | H01L 23/49811 257/685 |
| 8,455,987 B1 * | 6/2013 | Spann | H01L 23/49575 257/675 |
| 9,818,656 B1 | 11/2017 | Schlarmann et al. | |
| 10,134,685 B1 * | 11/2018 | Chen | H01L 24/19 |
| 2013/0260510 A1 * | 10/2013 | Theuss | H01L 21/76898 438/109 |

(Continued)

*Primary Examiner* — Thao P Le
(74) *Attorney, Agent, or Firm* — Mary Jo Bertani

(57) ABSTRACT

A semiconductor device includes a substrate, an IC die mounted on the substrate, packaging encapsulant on the substrate, a cavity in the packaging encapsulant, a conductive lid attached to the packaging encapsulant over the IC die, an electrical ground path in the substrate, and a first conductive structure in the cavity. The first conductive structure includes a first end electrically coupled to the conductive lid and a second end electrically coupled to the electrical ground path.

20 Claims, 6 Drawing Sheets

(56) References Cited

U.S. PATENT DOCUMENTS

2014/0091471 A1* 4/2014 Chen ............... H01L 25/18
                                               257/770
2020/0006219 A1* 1/2020 Chen ............... H01L 24/09
2020/0402878 A1* 12/2020 Daniels ........... H01L 23/552

* cited by examiner

GROUNDING LIDS IN INTEGRATED CIRCUIT DEVICES

BACKGROUND

Field

This disclosure relates generally to semiconductor devices, and more specifically, to grounding lids in semiconductor devices.

Related Art

Many electronic products, including semiconductor integrated circuit products, are sensitive to electro-magnetic interference (EMI). To help protect electronic circuitry from EMI, various shielding structures, such as metal walls or strips, can be included in a package to prevent the interfering signals from reaching the sensitive devices.

In other instances, some integrated circuit products are assembled or packaged with a metal lid to help dissipate heat generated by electronic components in an underlying cavity. While metal fins or other structures may be included to conduct heat from the components to the lid, the metal lid is generally electrically isolated, which means the lid is "floating" or not connected electrically to the circuits in the package. This does not present a problem because the lid is included to dissipate heat and does not require an electrical connection to the integrated circuitry to perform its function.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments disclosed herein provide a novel structure for packaged integrated circuit devices with conductive lids that are electrically grounded. The structure is formed during a packaging process before devices are singulated by connecting one end of a grounding structure such as a wirebond to a node within the cavity of one package and connecting the other end of the same wirebond to a node within the cavity of a second (usually neighboring) package. A metal lid is then attached to each of the packages using conductive adhesive that is in contact with the wirebonds. When each device is singulated and used in its application, each lid is grounded by the wirebond connected to the ground node in the cavity and provides EMI shielding. The structure can be fabricated using standard processes and flow for package assembly, thus providing an added advantage of using an existing metal structure for EMI shielding as well as to dissipate heat with little or no additional cost.

Figure 1:
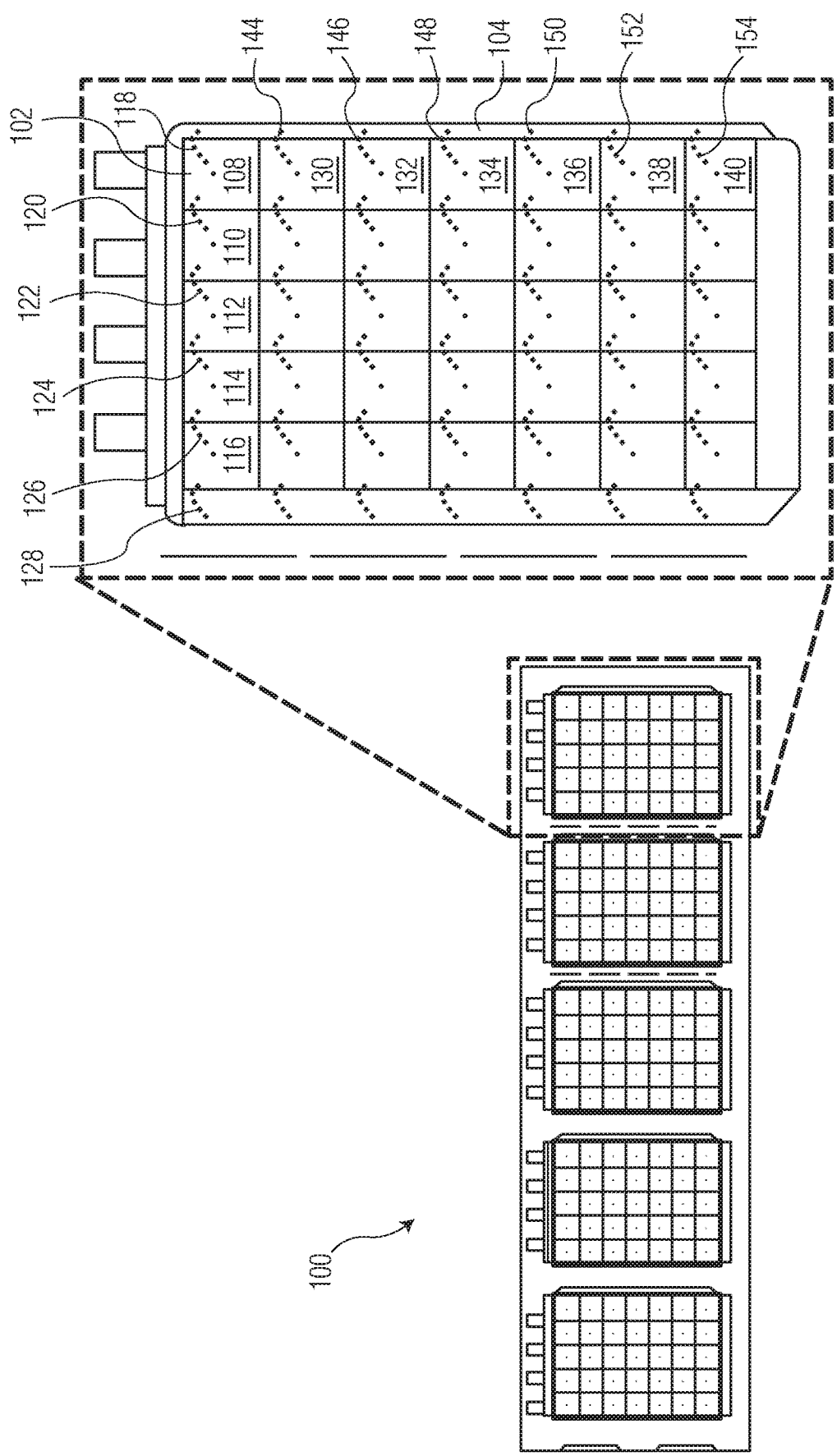
FIG. 1 is a top view of an array of integrated circuit devices in accordance with selected embodiments of the present invention.

FIG. 1 is a top view of assembly strip 100 showing five packaging mold blocks 104 with arrays 102 of packaged integrated circuit (IC) devices 108, 110, 112, 114, 116, 130, 132, 134, 136, 138, 140 mounted on mold blocks 104. The rightmost array 102 is enlarged in FIG. 1 to show IC devices 108-116 arranged next to one another in a top row of array 102 and IC devices 108-140 arranged next to one another in a rightmost column of array 102. Additional unnumbered IC devices are shown to complete two-dimensional array 102 with seven columns and five rows of IC devices, however, array 102 may include additional or fewer rows and/or columns of IC devices.

Wirebonds 118, 120, 122, 124, 126, 128 are formed between respective IC devices 108-140 and a neighboring IC device in accordance with selected embodiments of the present invention. For example, wirebonds 118 and 144-154 are formed between respective IC devices 108, 130-140 and adjacent portions of mold block 104. Wirebond 120 is formed with one end attached to a ground node in IC device 108 and another end attached to a ground node in IC device 110. Wirebond 122 is formed with one end attached to a ground node in IC device 110 and another end attached to a ground node in IC device 112. Wirebond 124 is formed with one end attached to a ground node in IC device 112 and another end attached to a ground node in IC device 114. Wirebond 126 is formed with one end attached to a ground node in IC device 114 and another end attached to a ground node in IC device 116. Wirebond 128 is formed with one end attached to a ground node in IC device 116 and an adjacent portion of mold block 104.

Wirebonds 144-154 in the rightmost column of array 102 are formed with one end attached to a ground node in respective IC devices 130-140 and another end on the edge of mold block 104. In the embodiment shown, wirebonds 118-128 are shown between a row of adjacent IC devices 108-116 and substrate 104, however, in other embodiments, wirebonds (not shown) may be formed between adjacent IC devices in a column and substrate 104, in addition to or instead of wirebonds 118-128 formed along a row of IC devices 108-116.

Figure 2:
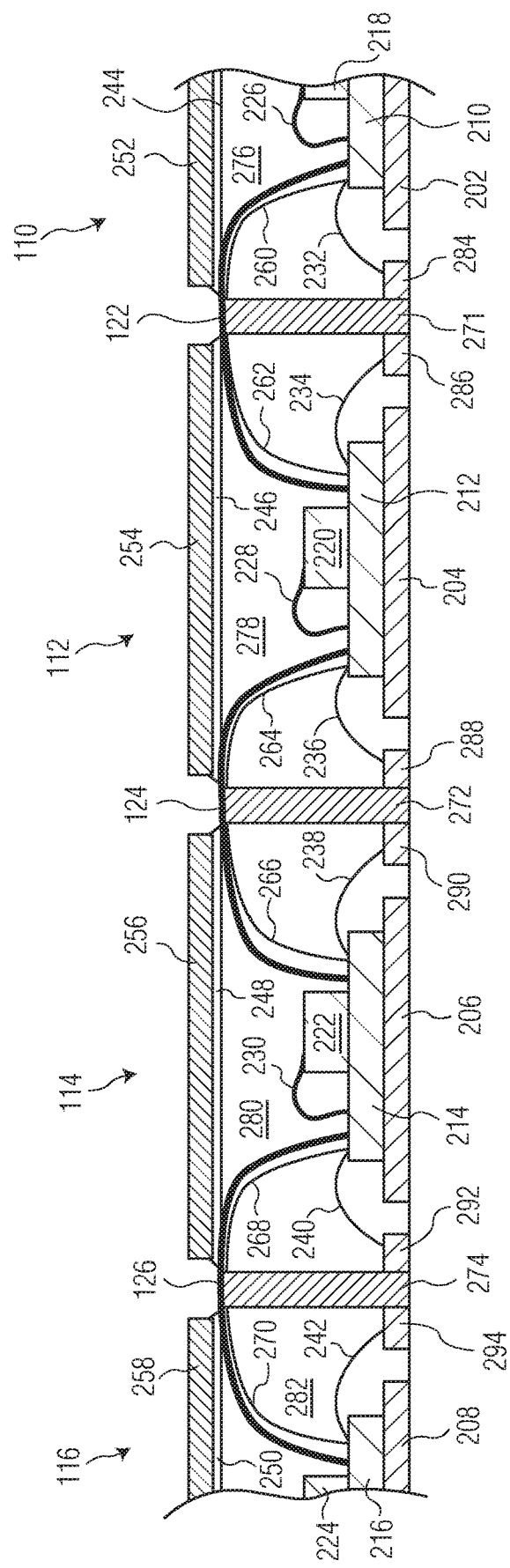
FIG. 2 is a side cross-sectional view of a portion of the integrated circuit devices of FIG. 1.

Referring to FIGS. 1 and 2, in the example shown, mold frame 104 is used in film assisted molding (FAM) processes to form packaged integrated circuit devices 110-116, 130-140. Strips or arrays of quad flat no lead leadframes 202-208 are placed in mold frame 104, and then integrated circuit die 210-216 are attached to leadframes 202-208 using adhesive and wirebonds between conductive pads (not shown) on the IC die and fingers on the lead frame. Note that wirebonds 118-128, 144-154 can alternatively or additionally be connected to a bond pad on IC die 210-216 that is coupled to a ground node on a respective leadframe 202-208. The path to ground may be coupled through IC die 210-216 and respective leadframe 202-208 to a ground node in a printed circuit board or other substrate to which IC devices 108-116, 130-140 are later attached or mounted.

FIG. 2 is a side view of a portion of the IC devices 110-116 of FIG. 1. Wirebonds 118-128, 144-154 are shown as dashed lines in FIG. 1 to indicate they are under lids 252, 254, 256, 258 of each IC device 108-116, 130-140. Lids 252-258 are made of metal or other electrically conductive material and are attached to the top of IC devices 110-116, as best shown by lids 252-258 in the cross-sectional view of IC devices 110, 112, 114, 116 in FIG. 2. When coupled to ground by wirebonds 118-128, 144-154, electrically conductive lids 252-258 provide EMI shielding. Lids 252-258 can also be thermally conductive to dissipate heat from components, such as IC die 218, 210, 212, 220, 214, 222, 216, 224, to protect components from an external environment, and/or other suitable purpose(s).

IC devices 110-116 include respective cavities 276, 278, 280, 282 with sidewalls 260, 262, 264, 266, 268, 270 covering some or all of wirebonds 232, 234, 236, 238, 240, 242 and a portion of corresponding IC die 210-216. Sidewalls 260-270 provide a continuous enclosure around respective cavities 276-282 and can be fabricated using a non-electrically conductive material, such as encapsulant, mold compound, or other suitable material. Sidewalls 260-270 can be formed using film-assisted molding after die 210-216 are placed and wirebonds 232-242 are formed. In other embodiments, sidewalls 260-270 can be part of pre-fabricated packages that are mounted on respective pads 284, 286, 288, 290, 292, 294 around corresponding substrate portions 202, 204, 206, 208. With pre-fabricated packages, IC die 210-216 and wirebonds 226-242 are placed/formed after the package is mounted in position. Leadframes 202-208 used with pre-fabricated packages can include additional fingers that can be used to connect wirebonds 118-128, 144-154 to a ground node.

IC devices 108-140 have not been singulated in FIGS. 1 and 2, so wirebonds 118-128 are shown as continuous between neighboring IC devices 108-140. One end of wirebond 118 is connected to frame 104 and another end is connected to a bond pad on an IC die (not shown) in IC device 108. Wirebond 120 includes a first end coupled to a die bond pad in IC device 108 and another end coupled to a bond pad (not shown) on IC die 210 (FIG. 2) in IC device 110. Wirebond 122 includes a first end coupled to a bond pad (not shown) on IC die 210 in IC device 110 and another end coupled to a bond pad (not shown) on IC die 212 (FIG. 2) in IC device 112. Wirebond 124 includes a first end coupled to a bond pad (not shown) on IC die 212 in IC device 112 and another end coupled to a bond pad (not shown) on IC die 214 (FIG. 2) in IC device 114. Wirebond 126 includes a first end coupled to a bond pad (not shown) on IC die 214 in IC device 114 and another end coupled to a bond pad (not shown) on IC die 216 (FIG. 2) in IC device 116. Note that array 102 is shown with five columns and seven rows of IC devices, however, additional or fewer rows and columns of IC devices may be included in array 102. Although not specifically numbered in FIG. 1 or described in detail herein, wirebonds similar to wirebonds 122-126 between IC devices 110-116 described above can be provided between the other neighboring IC devices in IC device array 102.

In the side view of IC devices 110-116 in FIG. 2, IC die 210-216 are mounted on respective substrate portions 202-208. IC die 210-216 may be packaged in any suitable package type such as through hole, surface mount, flat package, chip carrier, small outline, chipscale, pin grid array, ball grid array, or other suitable package type. Any suitable technique for mounting IC die 210-216 to respective substrate portions 202-208 can be used based on the package and substrate types. Substrate portions 202-208 may include integrated circuitry and electrically conductive structures that conduct signals between IC die 210-216 and structures to which IC devices 110-116 will be attached once array 102 is singulated.

Once die 210-216 are mounted on respective substrate portions 202-208, wirebonds 232, 234, 236, 238, 240, 242 are formed to electrically couple bond pads (not shown) on IC die 210-216 to respective bond pads (not shown) on substrate portions 202-208. Wirebonds 232-242 are used to communicate data and control signals between die 210-216 and components external to IC devices 110-116 when IC devices 110-116 are mounted on a substrate such as a printed circuit board with conductive traces connecting IC devices 110-116 to other components.

Mold compound or encapsulant may be formed using film assisted molding to form a package structure around respective substrate portions 202-208 after wirebonds 232-242 are formed, but before wirebonds 122-126 are formed. With film assisted molding, sidewalls 260-270 may increase in thickness as they extend toward substrate portions 202-208. Depending on the thickness of sidewalls 260-270, some portion or all of wirebonds 232-242 may be encapsulated by material forming sidewalls 260-270.

In selected embodiments, additional components such as IC die 218, 220, 222, 224 can be mounted on a major surface of a respective one of IC die 210, 212, 214, 216. Accordingly, cavities 276-282 are sized to accommodate placement of IC die 218-224 on respective IC die 210-216. One or more wirebonds 226, 228, 230, 232 may be formed to conduct signals between IC die 218-224 and IC die 210-216, however, die-to-die communication may be achieved using other structures such as through silicon vias or other suitable structures or techniques. IC die 218-224 and 210-216 can include circuitry to perform any desired function. For example, IC devices 110-116 may be Systems on a Chip that include die 218-224 for volatile or non-volatile memory while die 210-216 provide processing capability. In other examples, IC die 218-224 and/or 210-216 can include one or more sensors devices such as gyroscopes, accelerometers, actuators, and pressure sensors, among others, along with processing and memory functionality.

Wirebonds 122-126 may be formed between neighboring IC devices 110-116 by attaching each end of wirebonds 122-124 to a ground node bonding pad in neighboring IC devices. For example, wirebond 122 has one end attached to a ground node bond pad on IC die 210 and another end attached to a ground node bond pad on IC die 212. Scribe streets 271, 272, 274 are shown between respective IC devices 110-116. Scribe streets 271-274 provide space for material that is removed when IC devices 110-116 are singulated. Wirebonds 122-126 extend continuously into cavities 276-282 over respective sidewalls 260-270 and scribe streets 271-274 of IC devices 110-116 before singulation. In other embodiments, ends of wirebonds 122-126 may be attached to ground nodes on substrate portions 202-208, and/or on ground node bond pads on IC die 218-224. Although only one path to ground from lids 252-258 is required, IC devices 110-116 may include two or more wirebonds 122-126 to provide redundant paths to ground. In embodiments that only include a single path to ground, every other wirebonds may be omitted. For example, wirebond 124 may be omitted while wirebonds 122, 126 provide a single path to ground for respective lids 252-258.

Once wirebonds 122-126 are formed and all components such as IC die 218-224 and wirebonds 226-230 are installed, lids 252-258 are attached to the top edges of respective sidewalls 260-270 around cavities 276-282 of each IC device 110-116 using an electrically conductive adhesive 244-250 or other suitable material. In some embodiments, lids 252-258 may be in direct contact with wirebonds 122-126, reducing or eliminating the need for electrically conductive adhesive. It is however, important for wirebonds 122-126 to be electrically coupled to respective lids 252-258, whether through the use of electrically conductive adhesive 244-250, direct contact, or other structure/technique.

Lids 252-258 can be made from any suitable electrically conductive material such as, for example, stainless steel, copper, and plated copper, among others. Adhesive 244-250 is formulated to adhere to the material of sidewalls 260-270 and to lids 252-258.

Figure 3:
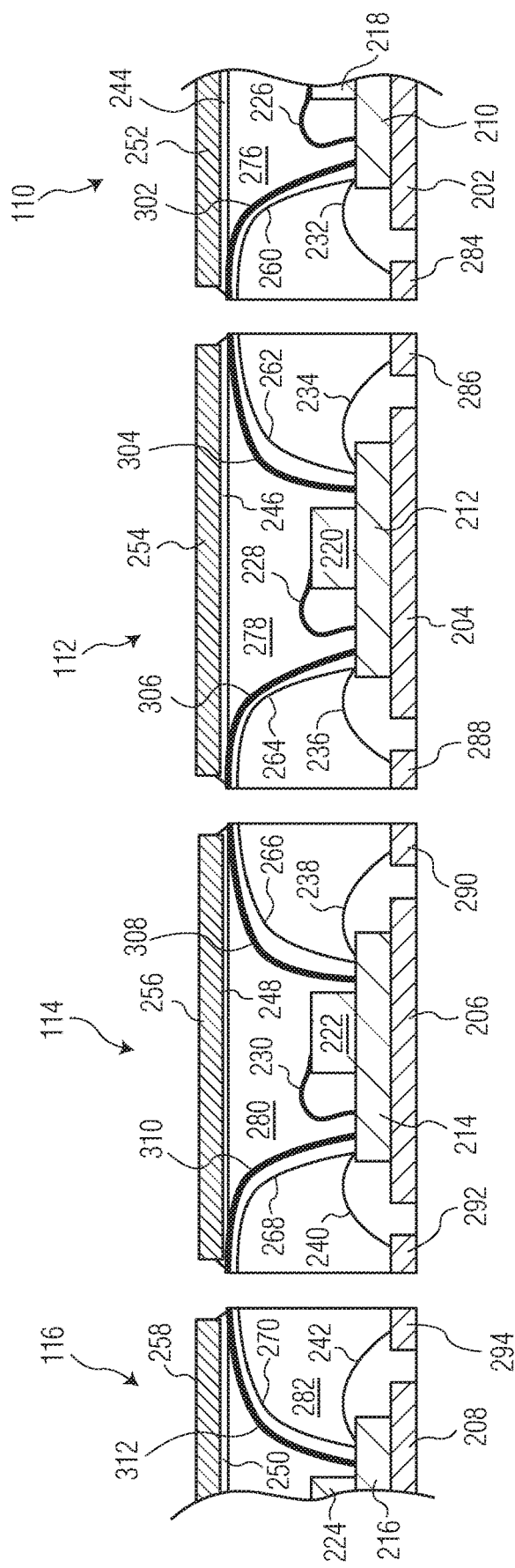
FIG. 3 is a side cross-sectional view of the integrated circuit devices of FIG. 2 during a subsequent stage of manufacture.

Referring to FIGS. 2 and 3, FIG. 3 is a side view of IC devices 110-116 of FIG. 2 during a subsequent stage of manufacture in which IC devices 110-116 are singulated by removing material in scribe streets 271-274 (FIG. 2). Any suitable technique for removing material in scribe streets 271-274 can be used such as using a mechanical saw, or a laser. Note that a portion of wirebonds 122-126 that overlaid scribe streets 271-274 is also removed during singulation, as best shown in FIG. 3, resulting in grounding structures 302, 304, 306, 308, 310, 312 that are not connected to neighboring IC device(s) 110-116.

Note that the process of fabricating IC devices 110-116 with grounded lids 252-258 is similar to the same process for making IC devices with lids that dissipate heat while IC die 210-216, 218-224 are operating with the exception that wirebonds 122-126 are formed before lids 252-258 are attached. Conductive adhesive 244-250 can be used to attach lids 252-258 instead of non-conductive adhesive, however, wirebonds 122-126 may be in direct contact with lids 252-258, in addition to, or instead of, the use of conductive adhesive. The direct contact between wirebonds 122-126 with lids 252-258 will be sufficient to electrically couple to a ground path through respective wire bonds 122-126.

Figure 4:
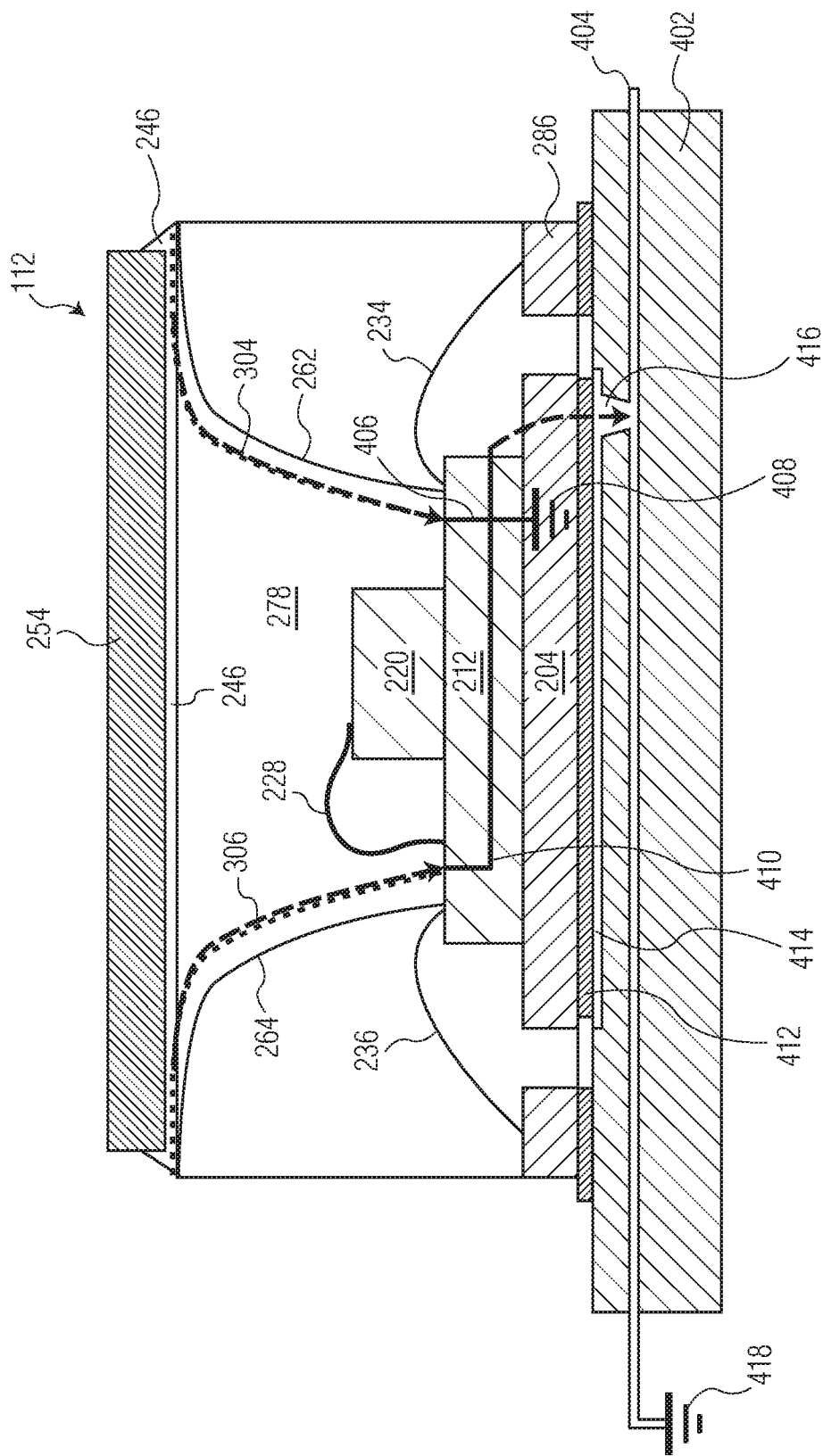
FIG. 4 illustrates an example of a conductive grounding path for one of the integrated circuit devices of FIG. 1.

FIG. 4 illustrates an example of a conductive grounding path for IC device 112 of FIG. 3. Lid 254 is electrically coupled to conductive structure 306 through adhesive 246, which may or may not be conductive adhesive. Conductive material 412 on the bottom of substrate 204 is electrically attached to metal line 414 on printed circuit board 402. Ground node 408 in substrate 204 is coupled to conductive material 412. Conductive structure 306 extends from lid 254 through cavity 278 to ground path 410 in IC die 212 and further along ground path 416 through substrate (leadframe) 204 into printed circuit board 402 where ground path 416 is connected to metal line 404 coupled to ground node 418. As a redundant grounding path, lid 254 is further electrically coupled to conductive structure 304 through adhesive 246. Conductive structure 304 extends through cavity 278 to a bond pad (not shown) on die 212. The bond pad is coupled to ground path 406 in IC die 212 that is connected to ground node 418 through ground path 416 and metal line 404. Ground paths 406, 410 can be coupled to respective ground contacts or pads on IC die 212.

Figure 5:
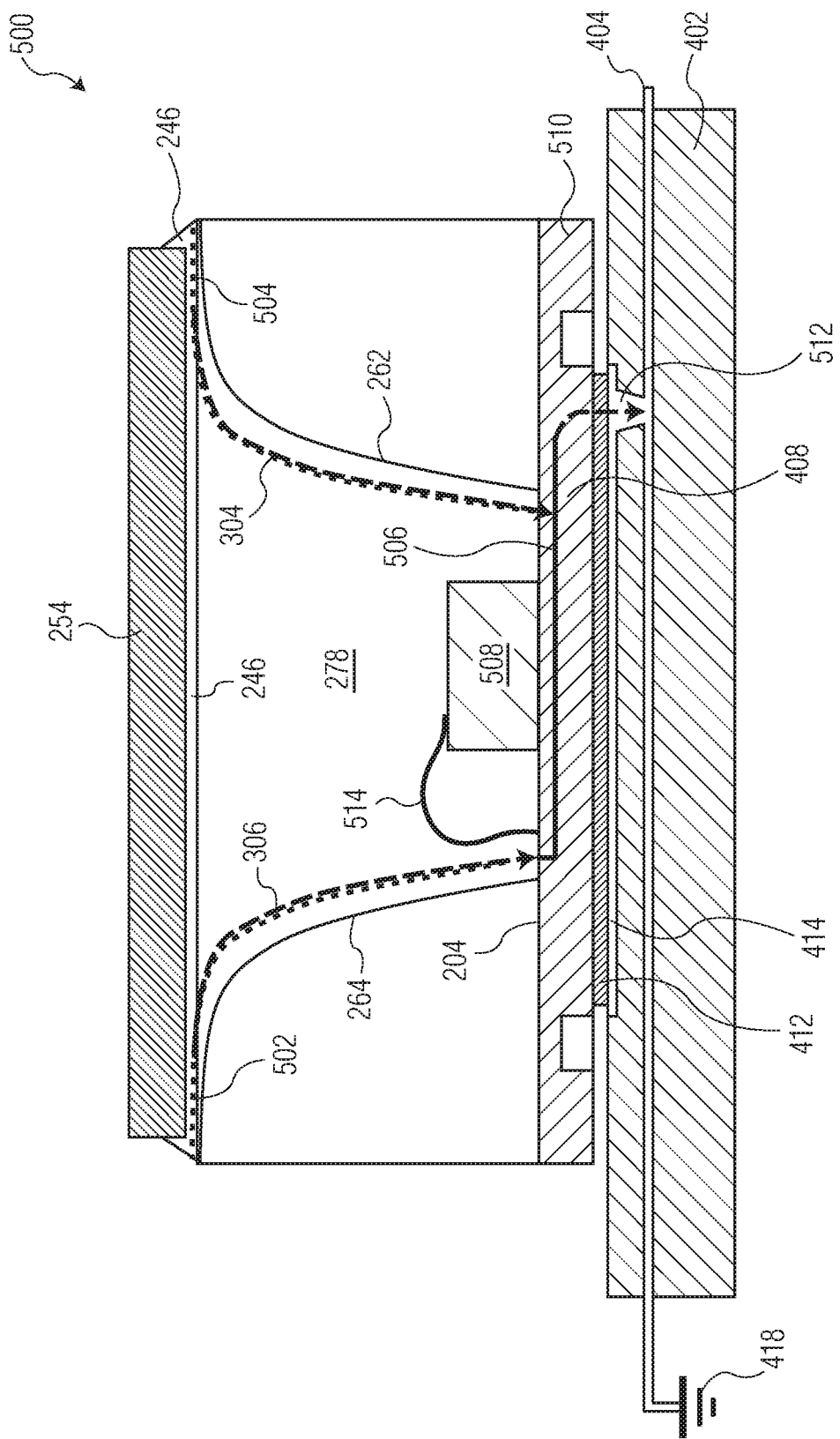
FIG. 5 illustrates another example of a conductive grounding path for an integrated circuit device in accordance with selected embodiments of the present invention.

FIG. 5 illustrates another example of a conductive grounding path 506 for IC device 500 that includes a single IC die 508 and one ground path 506 coupled to conductive structures 304, 306. Lid 254 is electrically coupled to conductive structure 306 through conductive adhesive 246. Conductive material 412 on the bottom of IC device 500 is electrically attached to metal line 414 on printed circuit board 402. Conductive structure 306 extends from lid 254 through cavity 278 to ground path 506 in substrate 510 and to conductive via 512 in printed circuit board 402. Via 512 is connected to metal line 404 and metal line 404 is coupled to ground node 418. As a redundant grounding path, lid 254 is further electrically coupled to conductive structure 304 through conductive adhesive 246. Conductive structure 304 extends through cavity 278 to ground path 506 in substrate 510 and to conductive via 512 in printed circuit board 402, thus coupling conductive structure to ground node 418 through metal line 404. Substrate 510 can include multiple layers in which routing and interconnections are formed to communicate signals between printed circuit board 402 and die 508 through wirebond(s) 514.

Figure 6:
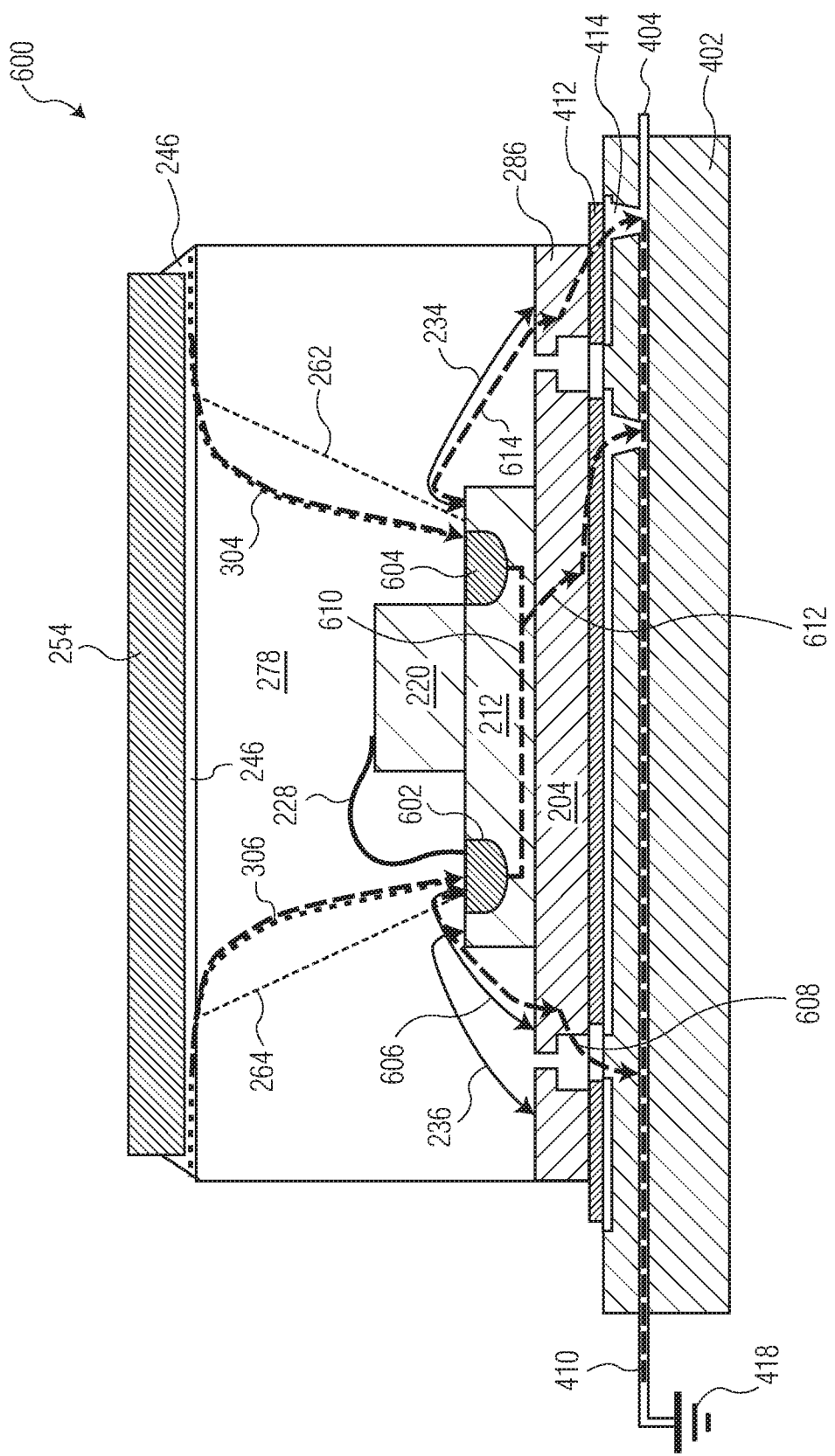
FIG. 6 illustrates another example of options for conductive grounding paths for an integrated circuit device in accordance with selected embodiments of the present invention.

FIG. 6 illustrates examples of options for conductive grounding paths for IC device 600. Lid 254 is electrically coupled to conductive structure 306 through adhesive 246, which may or may not be conductive adhesive. Conductive material 412 on the bottom of substrate 204 is electrically attached to metal line 414 on printed circuit board 402. Conductive structures 304, 306 extend from lid 254 through cavity 278 to respective bond pads 602, 604 on die 212. Bond pads 602, 604 are connected to ground path 610 that extends across/through IC die 212. A first grounding option includes wirebond 606 formed between bond pad 602 and a ground node in substrate 204 that is coupled to ground node 418 through ground paths 608 and 410. Wirebonds 306 and 606 are formed on bond pad 602, so lid 254 is also grounded along ground paths 608 and 410. Another grounding option includes wirebond 234 formed between a ground pad on die 212 and pad 286. Bond pad 604 is electrically connected to wirebond 234, so lid 254 is coupled to ground node 418 along ground path 614 to ground path 410. A third grounding option includes bond pads 602, 604 coupled to a well in die 212 that is tied to substrate 204 and ultimately to ground node 418 through ground paths 612 and 410.

By now it should be appreciated that adding one or more wirebonds 118-128, 144-154 after molding encapsulant to form package sidewalls 262, 264 surrounding cavity 278, but prior to attaching lid 254, enables lid 254 to provide EMI protection as well as to dissipate heat from IC device 112 during operation. The resulting conductive structures 304, 306 formed after IC device 112 is singulated extend from adhesive used to attach lid 254 to a top edge of sidewalls 262, 264 to a grounded node in cavity 278, through die 212 and/or substrate 204. IC device 112 may be fabricated using known processes and existing equipment. Wirebonds 122, 124 are relatively inexpensive compared to other structures and methods for grounding lid 254. Redundant conductive structures 304, 306 are easily formed and provide increased protection and reliability with little additional cost or production time.

In selected embodiments, a semiconductor device (112) can include a substrate (204), packaging encapsulant (110-116) on the substrate, an IC die (212) mounted on the substrate, a conductive lid (254) attached to the packaging encapsulant over the IC die, an electrical ground path (408, 410, 416, 506) in the substrate, and a first conductive structure (124, 306) in the cavity. The first conductive structure can include a first end electrically coupled to the conductive lid and a second end electrically coupled to the electrical ground path.

In some aspects, the semiconductor device can further comprise electrically conductive adhesive (412) in contact with the conductive lid, the packaging encapsulant, and the first end of the first conductive structure.

In other aspects, the first conductive structure can be a wirebond that is in direct contact with the lid.

In still other aspects, the first conductive structure (306) can be coupled to the electrical ground path (410) through the IC die (212).

In further aspects, the packaging encapsulant can be part of a quad flat no lead package.

In still further aspects, the semiconductor device can further comprise a second conductive structure (304) including a first end electrically coupled to the conductive lid and a second end electrically coupled to the electrical ground path.

In still further aspects, the second conductive structure can be a wirebond, and the second conductive structure can be coupled to the electrical ground path through the IC die.

In still further aspects, the semiconductor device can further comprise a printed circuit board (402), wherein the substrate can be electrically coupled to the printed circuit board, and the electrical ground path can be coupled to a second electrical ground path (404) in the printed circuit board.

In still further aspects, the substrate can be a conductive leadframe.

In still further aspects, a middle portion of the first conductive structure can be in a cavity in the packaging encapsulant and the first end of the first conductive structure can extend over a sidewall of the cavity.

In other embodiments, a method of making a semiconductor device can comprise attaching a first integrated circuit (IC) die to a first leadframe, attaching a first integrated circuit (IC) die to a second leadframe adjacent the first leadframe, forming encapsulant to form a first package on the first leadframe and a second package on the second leadframe, wherein the first and second packages include inner sidewalls around a respective cavity. A first electrical grounding structure is formed by attaching a first end of an electrically conductive material to a ground node in the cavity of the first package and a second end of the electrically conductive material to a ground node in the cavity of the second package. The electrically conductive material extends over a top edge of one of the sidewalls of each of the respective cavities of the first and second packages. A first lid is attached over the cavity of the first package and a second lid is attached over the cavity of the second package. The first electrical grounding structure is electrically coupled to the first and second lids.

In another aspect, the method can further comprise, before attaching the first lid over the cavity of first package, mounting a second IC die over the first IC die in the cavity of the first package, and forming wirebonds between conductive pads on first and second IC die.

In another aspect, the method can further comprise singulating the first and second packages after attaching the first and second lids. A portion of the first grounding structure can be removed between the first and second packages during singulation.

In another aspect, the method can further comprise forming the first electrical grounding structure using a wirebond between the ground nodes in the first and second cavities.

In another aspect, the method can further comprise attaching a first end of the wirebond to a ground node on the first IC die in the first package, and attaching a second end of the wirebond to a ground node on the first IC die in the second package.

In another aspect, the method can further comprise attaching a first end of the wirebond to a ground node on the first leadframe, and attaching a second end of the wirebond to a ground node on the second leadframe.

In another aspect, the method can further comprise coupling the ground node on the first IC die to a ground node on the first leadframe.

In another aspect, the method can further comprise forming the first electrical grounding structure using a wirebond between the ground nodes in the first and second cavities, wherein the wirebond between the ground nodes is formed after the wirebonds between the conductive pads of the first and second IC die are formed.

In another aspect, the method can further comprise forming wirebonds between conductive pads on first IC die and the first leadframe before the first package is formed.

In still other embodiments, a packaged semiconductor device can comprise a leadframe, a cavity over the leadframe, a lid over the cavity, an integrated circuit (IC) die in the cavity attached to the leadframe, and a wirebond having one end attached to a ground node in the cavity and another end embedded in electrically conductive adhesive attaching the lid to a top edge of a sidewall of the cavity.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
a substrate;
an IC die mounted on the substrate;
packaging encapsulant on the substrate;
a cavity in the packaging encapsulant;
a conductive lid attached to the packaging encapsulant over the IC die;
an electrical ground path in the substrate;
a first conductive structure in the cavity, the first conductive structure including a first end electrically coupled to the conductive lid and a second end electrically coupled to the electrical ground path.

2. The semiconductor device of claim 1 further comprising:
electrically conductive adhesive in contact with the conductive lid, the packaging encapsulant, and the first end of the first conductive structure.

3. The semiconductor device of claim 1 wherein:
the first conductive structure is a wirebond that is in direct contact with the lid.

4. The semiconductor device of claim 1 wherein:
the first conductive structure is coupled to the electrical ground path through the IC die.

5. The semiconductor device of claim 1 wherein:
the packaging encapsulant is part of a quad flat no lead package.

6. The semiconductor device of claim 1 further comprising:
a second conductive structure including a first end electrically coupled to the conductive lid and a second end electrically coupled to the electrical ground path.

7. The semiconductor device of claim 6 wherein:
the second conductive structure is a wirebond; and
the second conductive structure is coupled to the electrical ground path through the IC die.

8. The semiconductor device of claim 1 further comprising:
a printed circuit board, wherein the substrate is electrically coupled to the printed circuit board; and
the electrical ground path is coupled to a second electrical ground path in the printed circuit board.

9. The semiconductor device of claim 1 wherein:
the substrate is a conductive leadframe.

10. The device of claim 1 wherein a middle portion of the first conductive structure is in a cavity in the packaging encapsulant and the first end of the first conductive structure extends over a sidewall of the cavity.

11. A packaged semiconductor device comprising:
a leadframe;
a cavity over the leadframe;
a lid over the cavity;
an integrated circuit (IC) die in the cavity attached to the leadframe;
a wirebond having one end attached to a ground node in the cavity and another end embedded in adhesive attaching the lid to a top edge of a sidewall of the cavity, the lid being in electrical contact with the wirebond.

12. A semiconductor device comprising:
a first integrated circuit (IC) die attached to a first leadframe;
a first integrated circuit (IC) die attached to a second leadframe adjacent the first leadframe;
encapsulant forming a first package on the first leadframe and a second package on the second leadframe, wherein the first and second packages include inner sidewalls around a respective cavity;
a first electrical grounding structure having a first end of an electrically conductive material attached to a ground node in the cavity of the first package and a second end of the electrically conductive material attached to a ground node in the cavity of the second package, wherein the electrically conductive material extends over a top edge of one of the sidewalls of each of the respective cavities of the first and second packages;
a first lid attached over the cavity of the first package and a second lid attached over the cavity of the second package, the first electrical grounding structure being electrically coupled to the first and second lids.

13. The semiconductor device of claim 12 further comprising:
a second IC die mounted over the first IC die in the cavity of the first package, and
wirebonds formed between conductive pads on the first and second IC die.

14. The semiconductor device of claim 12 wherein:
the first and second packages are singulated after the first and second lids are attached, and a portion of the first grounding structure is removed between the first and second packages during the singulation.

15. The semiconductor device of claim 12 further comprising:
a wirebond forms the first electrical grounding structure between the ground nodes in the first and second cavities.

16. The semiconductor device of claim 15 further comprising:
a first end of the wirebond attached to a ground node on the first IC die in the first package; and
a second end of the wirebond attached to a ground node on the first IC die in the second package.

17. The semiconductor device of claim 15 further comprising:
a first end of the wirebond attached to a ground node on the first leadframe; and
a second end of the wirebond attached to a ground node on the second leadframe.

18. The semiconductor device of claim 16 further comprising:
the ground node on the first IC die is coupled to a ground node on the first leadframe.

19. The semiconductor device of claim 13 further comprising
  a wirebond forms the first electrical grounding structure between the ground nodes in the first and second cavities.

20. The semiconductor device of claim 16 further comprising:
  wirebonds formed between conductive pads on the first IC die and the first leadframe.

* * * * *